United States Patent [19]

Deevy et al.

[11] Patent Number: 5,644,312

[45] Date of Patent: Jul. 1, 1997

[54] ROM ENCODER CIRCUIT FOR FLASH ADC'S WITH TRANSISTOR SIZING TO PREVENT SPARKLE ERRORS

[75] Inventors: Kenneth T. Deevy; Philip Quinlan, both of Limerick, Ireland

[73] Assignee: Analog Devices, Inc., Norwood, Mass.

[21] Appl. No.: 346,753

[22] Filed: Nov. 30, 1994

[51] Int. Cl.$^6$ .............................. H03M 7/02; H03M 1/00
[52] U.S. Cl. ................................... 341/160; 341/159
[58] Field of Search ................................ 341/156, 158, 341/159, 160

[56] References Cited

U.S. PATENT DOCUMENTS

| | | |
|---|---|---|
| 4,644,322 | 2/1987 | Fujita . |
| 4,764,749 | 8/1988 | Machida . |
| 4,912,470 | 3/1990 | Hosotani et al. ............. 341/159 |
| 4,958,157 | 9/1990 | Miki et al. ................... 341/159 |
| 5,237,326 | 8/1993 | Jeong ........................... 341/160 |
| 5,260,706 | 11/1993 | Chung . |
| 5,315,301 | 5/1994 | Hosotani et al. ............. 341/160 |
| 5,489,905 | 2/1996 | Gross, Jr. et al. ............ 341/160 |

*Primary Examiner*—Howard L. Williams
*Attorney, Agent, or Firm*—Wolf, Greenfield & Sacks, P.C.

[57] ABSTRACT

A MOS ROM architecture which is fast-switching, requires almost no current under static conditions and only small current while switching, does not require a precharge mechanism and exhibits high immunity to electrical noise. A flash converter using this ROM architecture has a "one of" circuit driving a ROM encoder stage. The ROM constitutes a "one-of" to Gray- or modified Gray code encoder, or a "one-of" to binary encoder. Each bit cell in the ROM has a single NMOS transistor with its drain connected to either zero volts (representing logical 0) or to a $V_{DD}$ supply of, for example, 5 volts (representing logical 1). The transistor's source is connected to the bit line. All bit cell transistor gates for a given ROM address (i.e., location) are driven in parallel by an enable/disable signal. Preferably, the N-channel transistors whose drains are connected to logical 0 are about twice as large as those whose drains are connected to logical 1, to achieve desirable drain-to-source "on" resistance, $R_{on}$, and obtain a "low" output voltage when sparkle codes occur. Each bit line is connected to a buffer inverter whose trigger point is scaled to operate with a bit line that can only swing as high as $V_{DD}-V_T$ (i.e., one threshold voltage below the supply voltage, $V_{DD}$) when the bit line is connected to a logical 1. There is high noise immunity because the bit lines are always driven and do not float at high impedance. Static current is drawn only when there is a thermometer code bubble, causing bit cell transistors to contend for control of a bit line. Otherwise, current is needed only during switching.

9 Claims, 4 Drawing Sheets

ROM DATA OUTPUT

ROM ENCODER CIRCUIT FOR FLASH ADC'S WITH TRANSISTOR SIZING TO PREVENT SPARKLE ERRORS

FIELD OF THE INVENTION

This invention relates to the field of metal-oxide semiconductor (MOS) read-only memory (ROM) circuit designs for use in, for example, the encoder stages of "flash" type analog-to-digital converters (ADC's) wherein they are used as look-up tables to convert the output a "one-of" circuit (OOC) to a binary- or Gray-code digital word.

BACKGROUND OF THE INVENTION

Analog-to-digital converters are widely used to generate, from an analog input signal, a corresponding digital signal. The digital signal is actually a stream of (generally multi-bit) digitized values, each representing one sample of the analog input signal. These digital values may be used, for example, in digital signal processing algorithms to extract information from or transform the input signal in some way. Numerous types of converters exist for transforming analog signal samples to digital form. Each different type of converter has its particular advantages and disadvantages, and represents a trade-off among a number of operational and manufacturing characteristics.

Among the known types of analog-to-digital converters are so-called "flash", or parallel, converters. FIG. 1 illustrates a typical block diagram for a basic flash converter 10. The converter employs $2^N-1$ latched analog comparators $12_0 \ldots 12_M$ (where $M=2^n-2$) in parallel, where N is the number of bits of resolution in the desired digital output. A resistive voltage divider 14 driven by a stable reference source 16 provides the reference voltages for the comparators. The reference voltage for each comparator is at least one least-significant-bit (LSB) higher than the reference voltage for the comparator immediately below it.

When an analog input signal is present at the input of the comparator bank, all comparators which have a reference voltage below the level of the input signal will assume a logic "1" output. The comparators which have their reference voltage above the input signal will have a logic "0" output. This is referred to as a "thermometer" code.

Thus, except during transitions, the output of each comparator is either a high level, representing a binary 1, or a low level, representing a binary 0. However, since a finite time is required for the comparator outputs to change states when they are strobed and latched, the comparator output signals are not reliable until they have settled to their final values. Furthermore, if the input signal changes while the comparators are settling, the outputs can be erratic due to variations in dynamic performance among the comparators. Therefore, high-speed, high-resolution systems often employ an external track-and-hold circuit (not shown) which holds the analog input constant while the comparators are settling.

A decoding (or encoding, the two terms being synonomous herein) stage 18 receives the outputs of the comparators and converts them (directly or eventually) into a binary digital output. The decoding stage may assume several forms. For example, the decoding stage may be implemented as combinational logic. However, this approach requires a lot of semiconductor area and a considerable amount of power consumption. Therefore, another approach (illustrated in FIG. 1) is generally used, with the decoding stage implemented as a "one-of" circuit (OOC) 20 followed by one or two read-only memories (ROM's) 22. In the two-ROM systems such as the one shown in FIG. 1, a first ROM 22-1 generates a Gray-code or modified Gray-code digital output word from the OOC output and a second ROM 22-2 or a logic decode circuit converts the output of the first ROM to a binary-value word. In the single ROM systems, not shown, one ROM serves as a look-up table which directly provides a binary output from the OOC output. The difference between the one- and two-ROM approaches is discussed further below. Either way, the output of ROM(s) 22 typically is supplied to the rest of the system via a buffer (not shown).

Additional general background information on flash converters is contained in *Analog-Digital Conversion Handbook* (3d ed.; Daniel H. Sheingold, editor), Prentiss-Hall, Englewood Cliffs, N.J., 1986, pages 420–427, incorporated by reference.

In practice, due to mismatches and imperfections in the reference resistor ladder and in the latched comparators, as well as dynamic considerations such as those mentioned above, it does not always happen that a perfect thermometer code is produced at the comparator outputs. Sometimes, a comparator output which should be a "1" actually appears as a "0" at the instant the outputs of the comparators are read. This may happen, for example, if a comparator switches more slowly than is expected, so that the output is latched before it has reached its final state. When a "0" is sandwiched between two "1's" in the (one-dimensional) array of comparator outputs, an ambiguity may exist as to the value of the input signal. For example, if it is assumed that only a one-bit error occurred, either the sandwiched "0" may be an error or one of the two adjacent "1's" may be an error. Since such an error is analogous to a bubble occurring in the liquid of a mercury or alcohol thermometer, errors in the thermometer code often are called "bubbles" in the code. Of course, in addition to one-bit errors, two-bit (and higher order) errors (both adjacent and separated) also occur, though with lesser frequency. Consequently, numerous possible error conditions can exist and lead to erroneous interpretations of the output array from the comparators.

To appreciate the impact of bubbles in the thermometer code, it is helpful to understand how the thermometer code is decoded to provide an N-bit digital output word. As stated above, generally, two approaches exist. The first approach is to use a large amount of combinational logic to decode the possible arrangements of the comparator outputs. The design of such logic is explained in the literature. Error correction is built right into the logic, to the extent there is a defined output for a defined input. To reduce the necessary amount of circuitry and corresponding power consumption, the circuitry may not decode every conceivable input, since some of the potential inputs involve unlikely multiple-bit errors.

In the second approach, a "one-of" circuit ("OOC") reads the comparator outputs and detects the location of any 1-to-0 transitions in the thermometer code. (By convention, the transition under consideration is generally from a "lower" comparator output to a "higher" comparator output, where lower and higher refers to placement along the resistive ladder. The OOC has one output line for each possible value of the input signal—i.e., $2^N-1$ output lines. All output lines are held at a value of 0 except the output line which is mapped to the location of the detected transition. The output whose value is 1 is supposed to correspond to the most significant comparator output whose value is 1—i.e., the transition point in the thermometer code. In an ideal situation, this identifies the value of the input signal. However, if there is a bubble in the thermometer code, there will be multiple 0-to-1 transitions in the thermometer code, so there will be more than one "1" in the OOC output. This condition is referred to as "sparkle" or "sparkle codes" in the output of the OOC: one or more erroneous 0-to-1 transitions.

Each OOC output addresses (i.e., enables) a single (word length) location in a ROM. There is one N-bit ROM location for each of the $2^N-1$ output lines of the OOC. When an OOC output line carries a voltage corresponding to a logical 1 value, the corresponding ROM location is said to be "enabled" and its contents are impressed on the ROM output bit lines and provided as the ROM output. The ROM thus serves as a look-up table to decode the meaning of the OOC outputs.

If a single-step ROM conversion process is used, the codes stored in the ROM locations are binary values corresponding to the OOC output lines. Sparkle codes, however, can cause large errors in the decoding of the OOC output. By virtue of ROM construction, if two or more ROM locations are enabled by multiple 1's in the OOC output, the ROM output will be the logical AND or OR of the contents of those locations. This can produce a digital output value which may contain large errors, since the logical combination of two binary values could be very different from either of them.

To reduce the magnitude of such errors, the OOC output is sometimes converted in a first ROM (22-1) to a Gray- or modified Gray-code, which is then converted to a binary code in a second ROM (22-2). This is helpful because the logical combination of two Gray- (or similarly) coded numbers generally is closer in value to at least one of them than is true for a similar combination of pure binary numbers.

Overall, many performance characteristics of the converter are influenced considerably by the design of the ROM or ROMs in the decoding stage. The selection of a particular circuit architecture for the ROM(s) will impact power consumption, conversion speed, and other specifications. The present invention has utility with respect to ROM's fabricated in metal-oxide semiconductor (MOS) technology.

Referring to FIG. 2, a portion is illustrated of one type of an exemplary MOS ROM 25. Just two ROM locations 24 and 26 are depicted, each for storing four bits of information to be supplied (eventually, when the location is read) via ROM data lines (i.e., bit lines) B1–B4. In each location, one transistor is provided for each zero-valued bit of information to be stored in the ROM; current sources $28_1$–$28_4$ charge the bit lines high and those transistors pull the corresponding bit lines low. Information is stored in (i.e., impressed upon) a ROM location by providing and permanently connecting, for each zero-valued bit, one NMOS transistor with its drain connected to the bit line and its source connected to ground. All other bits automatically will be set to a logical high, or 1, value by the presence of the current sources. It will be appreciated, of course, that the design is extendable to a ROM of arbitrary size (as are all the ROM designs discussed herein). For purposes of this description, each collection of transistors corresponding to a given ROM address is referred to as a ROM "location." As shown in FIG. 2, each location has at most one transistor connected to control the state of each of the corresponding output bit lines B1 . . . Bn (where in this case, n=4). Each bit line is also connected to a supply voltage V+ via a current source $28_i$ (where i is just a subscript placeholder). The transistors for a location are selectively turned on by the OOC output lines. That is, all of the transistors for a given ROM location have their gates connected together and to one output of the OOC. If the OOC output is high, or logical 1 value, the transistors are turned on; if the OOC output is low, the transistors are turned off. The bit lines not having such transistors are always high.

The current sources are sized to pull the bit lines toward V+, by charging the parasitic capacitance on the input of the next stage (often a buffer) driven by the bit lines, and ensuring a 1 output when all pull-down transistors on the bit line are turned off.

With a suitable change in the topology (i.e., connecting the current sources between the bit lines and ground), PMOS transistors can be used instead of NMOS transistors, of course.

The use of a design such as that of FIG. 2 imposes a tradeoff between speed and power (current) consumption. To charge the parasitic capacitance faster, a larger current source is needed. However, to discharge the parasitic capacitance and pull down the bit line against a larger current source, the transistor must be larger and it must carry more current. This both increases the chip area which must be devoted to the transistor and increases the current drawn by the ROM during static and switching conditions. Yet the designer generally will want to reduce the current required by the ROM (both statically and dynamically) and use minimum chip area, while also providing a high speed memory. Consequently, these criteria are in conflict and tradeoffs are required.

To reduce the static current drain which arises from the use of current sources which are always on, a ROM implementation such as that of FIG. 3 (at 30) is sometimes employed. (Only two ROM locations are shown.) In this approach, a transistor is provided only for ROM cells which are to be set to zero. The source of each such ROM cell transistor $32i,34i$ is grounded and its drain is connected to a high-impedance bit line (B1 . . . Bn). Each bit line $B_j$ is also connected to the drain of a precharge transistor $36_j$. The sources of the precharge transistors are connected to a voltage source $V_{DD}$ and all of the precharge transistors have their gates connected together to receive a precharge pulse (applied at 38). When the precharge pulse turns on the precharge transistors, the bit lines are charged to a high, logical 1 level. They remain in that state unless pulled low by one of the ROM cell transistors. This configuration meets the goal of reduced static current requirements, but it requires the addition of control circuitry (not shown) for precharging the bit lines in advance of each conversion cycle and it increases susceptibility to noise (i.e., the potential for electrical noise to corrupt the output data). When the precharge transistors are turned off, the high impedance bit lines are at times not being driven. They can therefore pick up noise easily. Additionally, switching transients can be coupled between such high impedance lines in very unpredictable ways; for example, a bit line may go low due to a high speed switching node capacitively coupling noise into the ROM data line.

As stated above, the principal technique for minimizing the errors cause by sparkle code in the OOC output is to employ a "one-of" to Gray- (or modified-Gray-) code converter ROM cascaded with a Gray- (or modified-Gray-) code to binary-code converter ROM. However, this does not, in and of itself, eliminate the problem of high impedance bit lines.

SUMMARY OF THE INVENTION

According to a first aspect of the invention, there is provided a MOS ROM architecture which is fast-switching, requires almost no current under static conditions and only small current while switching, does not require a precharge mechanism and exhibits high immunity to electrical noise. According to a second aspect of the invention, a flash converter uses this ROM architecture, and is shown, in an encoder stage providing a ROM-based "one-of" to Gray- or modified Gray code encoder, or a "one-of" or Gray/ modified- Gray code to binary encoder.

Each of the ROM bit lines, which provide the ROM output, is connected to either a logic 1 or a logic 0 level through an NMOS transistor. For an NMOS transistor, the logic 1 level will only reach a maximum of $V_{DD}-V_T$ (i.e., one threshold voltage below the supply voltage, $V_{DD}$). To account for this reduced logic swing, the bit lines are connected to a buffer inverter with a suitably scaled trigger point.

If two or three ROM locations are addressed (i.e., enabled) at the same time due to occurrence of a sparkle code problem, the resulting output on each bit line is the logical AND of the corresponding bit values from those enabled ROM locations. When the ROM provides Gray-code values, suppression of sparkle code errors is facilitated.

Each bit cell in the ROM has a single NMOS transistor with its drain connected to either zero volts (representing logical 0) or to a $V_{DD}$ supply of, for example, 5 volts (representing logical 1). The transistor's source is connected to the bit line. All bit cell transistor gates for a given ROM address (i.e., location) are driven in parallel by an enable/disable signal. Preferably, the N-channel transistors whose drains are connected to logical 0 are twice as large as those whose drains are connected to logical 1, to achieve desirable drain-to-source "on" resistance, $R_{on}$, and obtain a "low" output voltage when sparkle codes occur.

There is high noise immunity because the bit lines are always driven and do not float at high impedance. Static current is drawn only when there is a bubble, causing bit cell transistors to contend for control of a bit line. Otherwise, current is needed only during switching.

The invention will be more fully understood from the detailed description presented below, which should be read in conjunction with the accompanying drawing.

DETAILED DESCRIPTION

Figure 1:
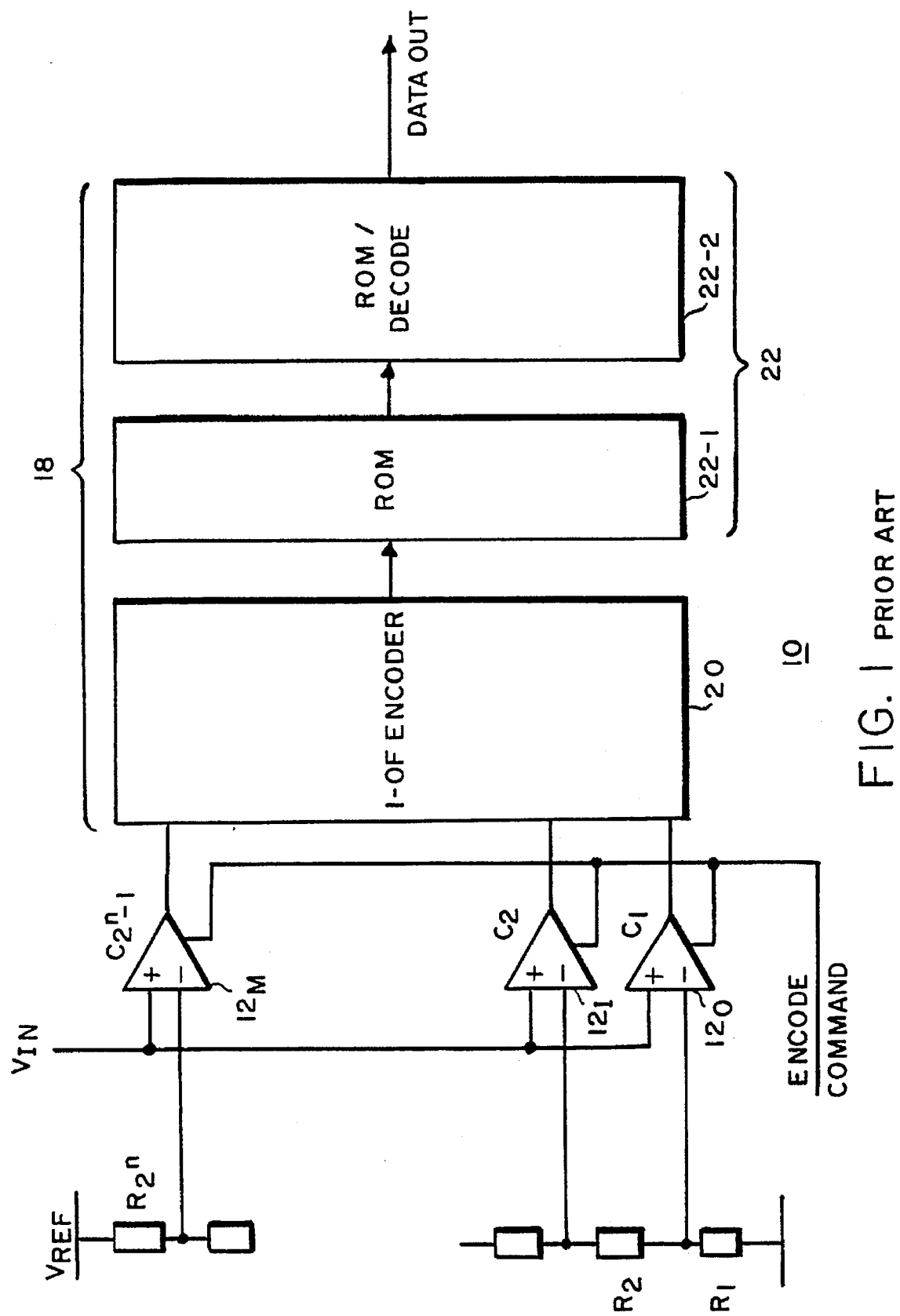
FIG. 1 is a basic block diagram of a prior art flash-type analog-to-digital converter.
Figure 2:
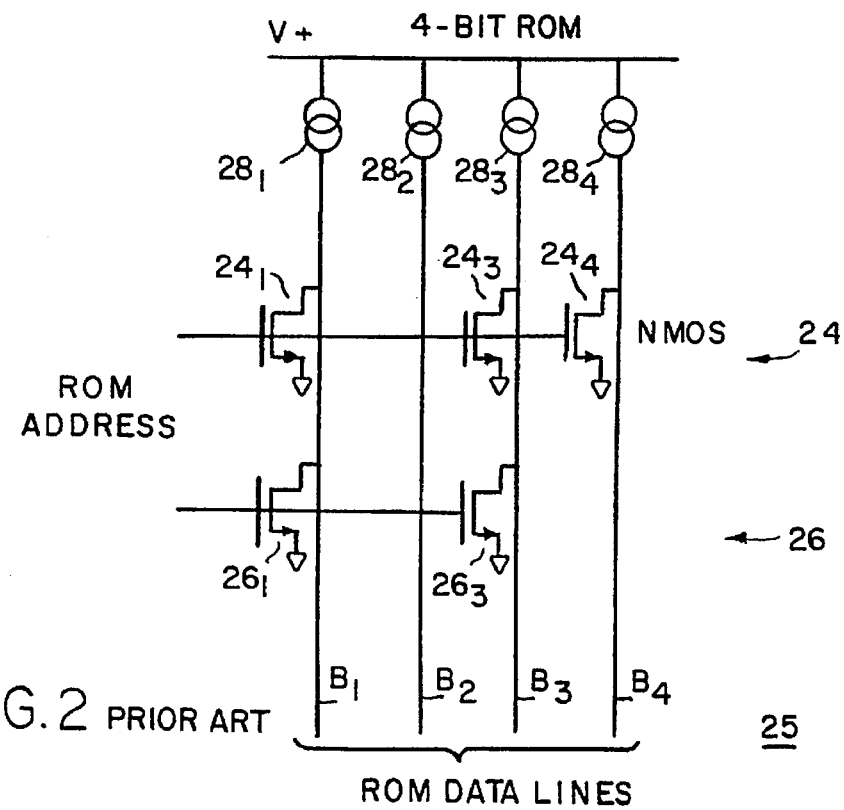
FIG. 2 is a simplified schematic circuit diagram of a first type of prior art ROM used in the encoder stage of a flash converter according to FIG. 1.
Figure 3:
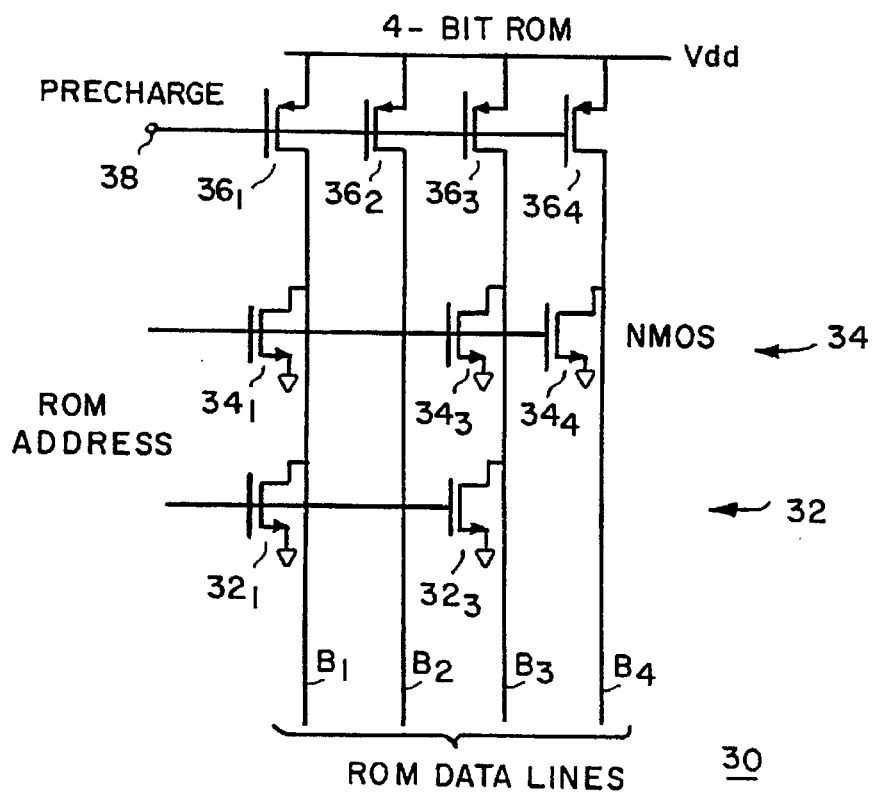
FIG. 3 is a simplified schematic circuit diagram of a second type of prior art ROM used in the encoder stage of a flash converter according to FIG. 1.
Figure 4:
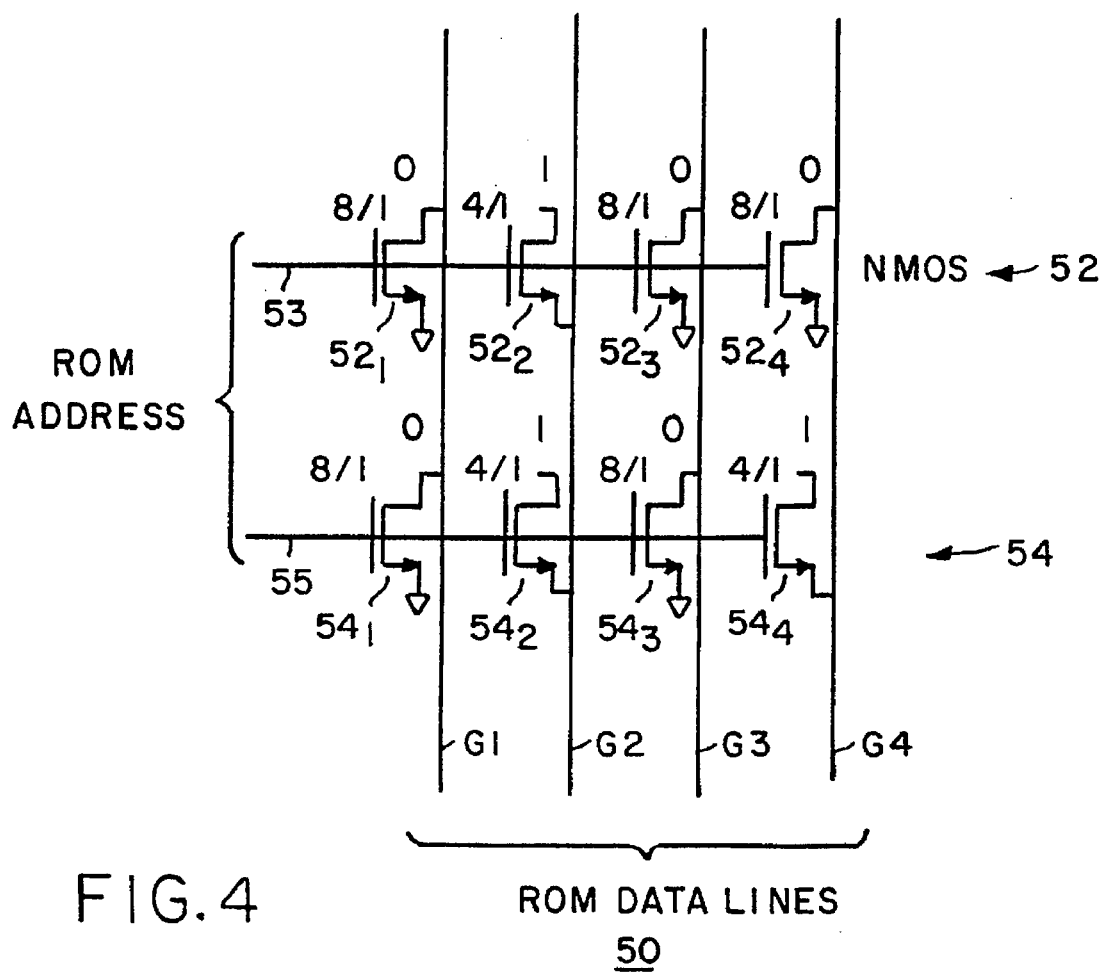
FIG. 4 is a schematic circuit diagram showing two four-bit locations of an exemplary ROM or ROM encoder according to the present invention.

Turning to FIG. 4, there are shown two locations 52 and 54 of an exemplary embodiment of a ROM encoder circuit 50 according to the invention. In this embodiment, the ROM is implemented with NMOS transistors, but it will be understood that PMOS devices can be used with routine modifications. Each output line of the OOC circuit uniquely addresses a specific location in the ROM via one of the address bus lines, e.g., 53 and 55. (A four-bit resolution is illustrated for the converter, but the invention is applicable to a converter—and ROM—of arbitrary resolution—and word size.) Only one output line of the OOC circuit should be active at any given time. When two of the address lines to the ROM become active—i.e., enabled, instead of one, there are three possible conditions that can exist on any of the ROM bit lines G1–G4. The first condition is that the two transistors driving the bit lines can connect the bit line to 0 volts, representing a logic 0, For example, in FIG. 4, assume address lines 53 and 55 are both enabled; then transistors $52_1$ and $54_1$ are both turned on. The same is true for transistors $52_3$ and $54_3$. The second possibility is that the two transistors connect the bit line to a voltage $V_{DD}-V_T$ (i.e., the supply voltage less a MOS transistor threshold voltage). This is illustrated in FIG. 4 by transistors $52_2$ and $54_2$. The third possibility is that one transistor is trying to pull the bit line to 0 volts while the other tries to pull the bit line toward the positive supply. When this occurs, the NMOS device that is pulling the output low will dominate (by virtue of its relative sizing) and the output will go towards ground. This possibility is shown in FIG. 4 by transistors $52_4$ and $54_4$.

It should be appreciated that when the MOSFETs $52_i$, $54_i$ operate in the non-saturated mode, there is no real distinction between the roles of source and drain. Thus, the embodiments of FIGS. 4 and 5 (discussed below) are equivalent.

By scaling the NMOS transistors $52_i$, $54_i$, an operation resembling a majority vote can be achieved. If two transistors connected to the same bit line compete (i.e., two ROM locations are simultaneously enabled), with one transistor connected to ground and the other connected to $V_{DD}$ (i.e., logical 1), the transistor connected to the logical low, or ground, will (with proper scaling) have more gate drive and will dominate, pulling down the bit line to approximately $$V_o = (V_{DD}-V_T)-[2(\beta_2/\beta_1)V_o(V_{DD}-V_T)]^{1/2}.$$

where $\beta_1$=transconductance parameter of NMOS device pulling bit line high $\beta_2$=transconductance parameter of NMOS device pulling bit line low $V_T$=the threshold voltage for the MOS transistors being used.

If this $V_o$ is below the trigger point of the inverter which buffers the output of the bit line for driving subsequent circuitry, the inverter detects a logical low level on its input. Thus, both transistors will have to be connected to a high in order to trigger the inverter. This is equivalent to performing a logical "AND" of the contents of the ROM locations (at the inverter input). To ensure this operation, in an exemplary embodiment the pull down devices (i.e., transistors whose drains are connected to logical 0, or ground) may, for example, be made twice as wide as the pull up transistors whose drains are connected to logical 1 ($V_{DD}$). In FIG. 4, using one set of possible dimensions, this is indicated by the width/length ratio 8/1 or 4/1, respectively, printed next to each transistor; of course, other dimensions can be chosen.

Figure 6:
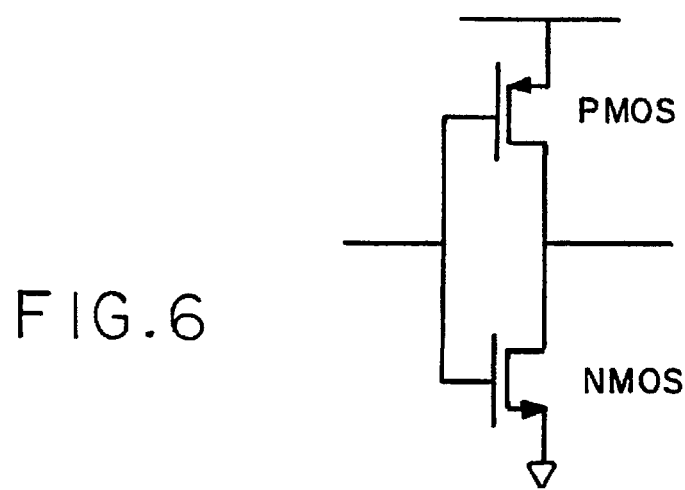
FIG. 6 is an exemplary schematic circuit diagram for an inverter/buffer usable in connection with the ROM of FIGS. 4 and 5.
Figure 5:
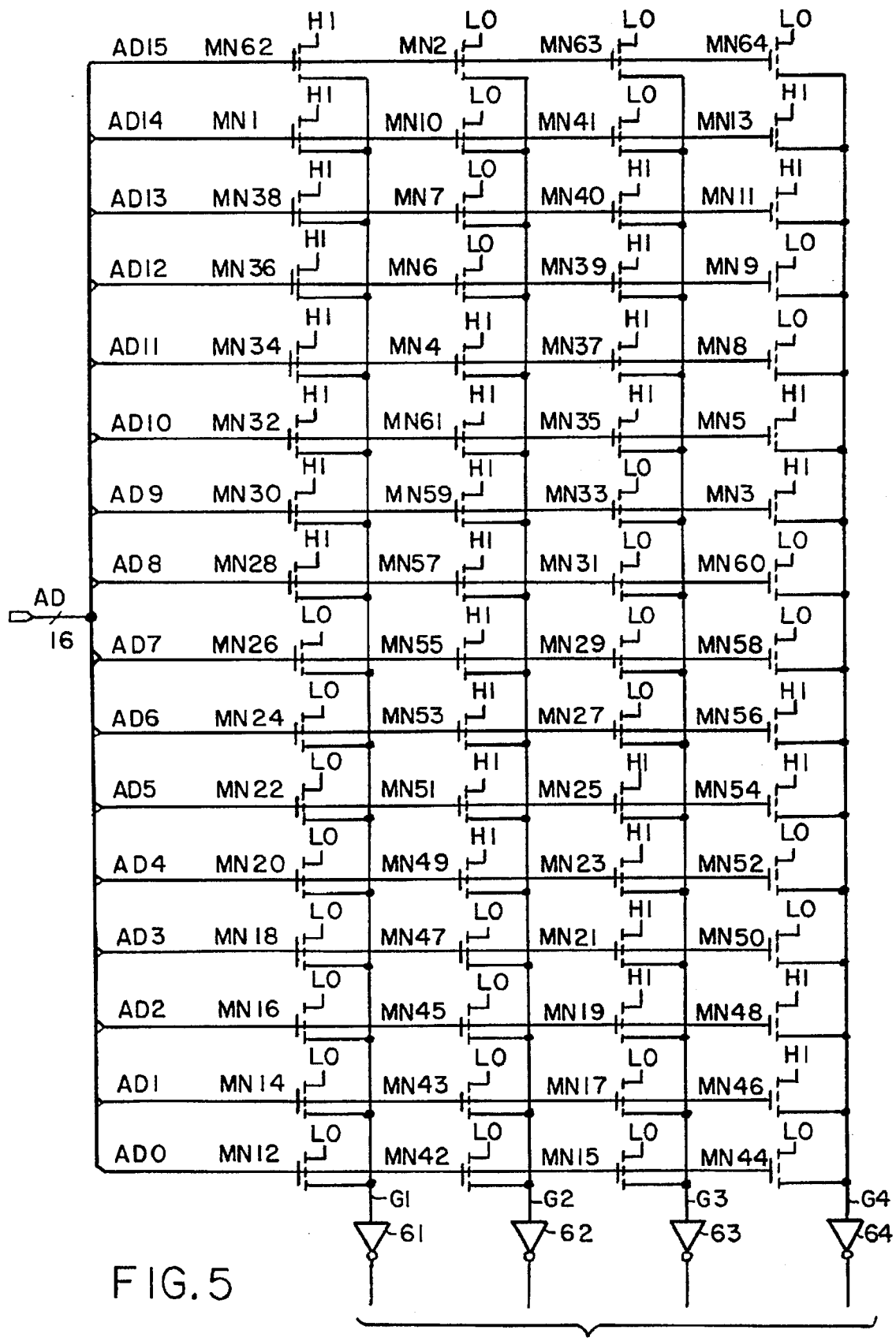
FIG. 5 is a schematic circuit diagram of an exemplary four-bit ROM or ROM encoder according to the invention, adapted to provide a Gray-encoded output.

Turning now to FIG. 5, there is shown a full schematic circuit diagram for an exemplary four-bit ROM implementing the invention of FIG. 4 using Gray-coding for the ROM contents. The inverters G1–G4 which receive the signals from bit lines G1–G4 are designed to have thresholds (i.e., trigger points) as recited above—i.e., high enough that the inverter is not triggered when two transistors compete, one pulling up and the other pulling down. While those skilled in the art can readily design a variety of suitable inverter circuits, an exemplary inverter circuit is shown in FIG. 6.

Having thus described the basic concept of the invention, it will be readily apparent to those skilled in the art that the foregoing detailed disclosure is intended to be presented by way of example only, and is not limiting. Various alterations, improvements, and modifications will occur and are intended to those skilled in the art, though not expressly stated herein. These modifications, alterations, and improvements are intended to be suggested hereby, and are within the spirit and scope of the invention. For example, a PMOS counterpart to the circuit of FIG. 4 can be implemented. The ROM can be designed with an arbitrary number of locations of corresponding word length. The ROM may preferably, as illustrated, provide a Gray-encoded mapping of address to output, or it may provide a binary mapping or another mapping. The basic design can be modified, as well, so long as multiple enabled outputs are ANDed, negligible current is drawn under static conditions, switching is fast and bit lines are not highly susceptible to noise. Accordingly, the invention is limited only by the following claims and equivalents thereto:

What is claimed is:

1. A ROM encoder stage for use in a flash analog-to-digital converter, the ROM encoder stage receiving as inputs a plurality of outputs from a "one-of" circuit, comprising:

a ROM having a plurality of n-bit locations, each location containing n bit cells storing one bit each and addressable by one of the inputs and, when addressed, driving a corresponding bit line in accordance with the bit value stored in said bit cell;

each ROM bit cell having a MOS transistor with a source-drain path connected between the corresponding bit line and a voltage representing a logic value, and a gate electrode connected to receive the input addressing the ROM location of the bit cell;

an output inverter connected to each bit line, said inverter having a trigger point such that if an input to the inverter is below the trigger point, the inverter supplies a logical high output, but if the input to the inverter is above the trigger point, the inverter supplies a logical low output; and the MOS transistors being sized such that when first and second locations are enabled concurrently and the drain-source path of a MOS transistor in the first location and the drain-source path of a MOS transistor in the second location are connected to the same bit line, with the drain-source path of the first transistor also connected to a logic low level and the drain-source path of the second transistor also connected to a logic high level, the first transistor will pull the bit line to a voltage below the trigger point of the inverter.

2. A ROM encoder as in claim 1 having only a single ROM.

3. A ROM encoder as in claim 2, wherein when two ROM locations are enabled concurrently, the output on each associated bit line corresponds to an AND of the corresponding bit values from the enabled ROM locations.

4. A ROM encoder as in claim 3, wherein the ROM provides Gray-code or modified Gray-code values.

5. A ROM encoder as in claim 2, wherein the ROM provides Gray-code or modified Gray-code values.

6. A ROM encoder as in claim 1, wherein the inverter selectively inverts only when the MOS transistors in the first and second locations both connect the corresponding bit line to a logical high level.

7. A ROM encoder as in claim 6, wherein the ROM provides Gray-code or modified Gray-code values.

8. A ROM encoder as in claim 1, wherein the ROM provides Gray-code or modified Gray-code values.

9. A ROM as in claim 1, wherein the MOS transistors are N channel and the sizing of the NMOS transistors is such that the NMOS transistors whose drain-source paths are connected to a logical low are substantially twice as large as the NMOS transistors whose drain-source paths are connected to a logical high.

\* \* \* \* \*